United States Patent
Mitsumoto

(10) Patent No.: US 10,897,093 B2
(45) Date of Patent: Jan. 19, 2021

(54) SEMICONDUCTOR APPARATUS

(71) Applicant: FUJI ELECTRIC CO., LTD., Kawasaki (JP)

(72) Inventor: Takahiro Mitsumoto, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/459,514

(22) Filed: Jul. 1, 2019

(65) Prior Publication Data
US 2020/0052420 A1 Feb. 13, 2020

(30) Foreign Application Priority Data

Aug. 7, 2018 (JP) ................. 2018-148281

(51) Int. Cl.
| | | |
|---|---|---|
| H01L 23/049 | (2006.01) | |
| H01R 4/30 | (2006.01) | |
| H01L 23/00 | (2006.01) | |
| H01L 23/538 | (2006.01) | |
| H01L 25/07 | (2006.01) | |
| H01L 25/18 | (2006.01) | |

(52) U.S. Cl.
CPC .......... H01R 4/305 (2013.01); H01L 23/049 (2013.01); H01L 23/564 (2013.01); *H01L 23/5383* (2013.01); *H01L 25/072* (2013.01); *H01L 25/18* (2013.01)

(58) Field of Classification Search
CPC ... H01L 23/049; H01L 23/053; H01L 23/564; H01L 25/072

USPC ......................................................... 257/698
See application file for complete search history.

(56) References Cited

U.S. PATENT DOCUMENTS

| | | | |
|---|---|---|---|
| 6,774,468 | B2 | 8/2004 | Ogawa |
| 2012/0153451 | A1 | 6/2012 | Hayashida |
| 2015/0077943 | A1 | 3/2015 | Miyake et al. |
| 2015/0308632 | A1* | 10/2015 | Ueno ............... F21V 23/023 362/235 |
| 2015/0369461 | A1* | 12/2015 | Yokotani .......... F21V 31/005 362/293 |
| 2017/0042051 | A1 | 2/2017 | Kodaira |
| 2017/0200704 | A1 | 7/2017 | Kodaira |
| 2018/0122715 | A1 | 5/2018 | Kodaira |

FOREIGN PATENT DOCUMENTS

| | | |
|---|---|---|
| JP | 3864130 B2 | 12/2006 |
| JP | 4118789 B2 | 7/2008 |
| JP | 2012134300 A | 7/2012 |
| JP | 2015056614 A | 3/2015 |
| JP | 2017034162 A | 2/2017 |
| WO | 2016163237 A1 | 10/2016 |
| WO | 2017122473 A1 | 7/2017 |

* cited by examiner

Primary Examiner — Long K Tran
(74) Attorney, Agent, or Firm — Rabin & Berdo, P.C.

(57) ABSTRACT

In order to prevent breakage of a nut holder that holds a nut, a semiconductor apparatus includes a main terminal connected to an external conductor by a screw, a nut into which a tip of the screw is screwed, and a nut holder. The nut holder includes a recess holding the nut therein, and a peripheral wall surrounding the recess and having an opening. The peripheral wall is discontinuous at a position at which the opening is formed.

11 Claims, 6 Drawing Sheets

X DIRECTION

Y DIRECTION

STRESS CONCENTRATION POINT

SEMICONDUCTOR APPARATUS

CROSS REFERENCE TO RELATED APPLICATION

This application is based upon and claims the benefit of priority from the prior Japanese Patent Application No. 2018-148281, filed on Aug. 7, 2018; the entire contents of which are incorporated herein by reference.

BACKGROUND OF THE INVENTION

Field of the Invention

The present invention is related to a semiconductor apparatus.

Description of the Related Art

Semiconductor apparatuses, which have a substrate provided with semiconductor elements such as for example an insulated gate bipolar transistor (IGBT), a power metal oxide semiconductor field effect transistor (power MOSFET), and a free wheeling diode (FWD), are used for various apparatuses such as inverters.

This type of power semiconductor apparatus has a resin case component for housing the substrate, and the case component has a hexagonal nut inserted into itself so as to screw a terminal component for an external wire (see, for example, Patent Document 1). As a specific example, Patent Document 1 describes a case component having a nut-insertion hole, into which a hexagonal nut is to be inserted. The nut-insertion hole has a terminal-component-insertion hole around it, into which a terminal component is to be inserted.

PRIOR ART DOCUMENTS

Patent Documents

[Patent Document 1] Japanese Laid-open Patent Publication No. 2015-56614

SUMMARY

The invention of Patent Document 1, however, will have a thin portion around the nut-insertion hole depending on positional relationships between the nut-insertion hole and the terminal-component-insertion hole. This leads to a possibility that a rotative force of the nut caused by tightening the screw will break the case component (the portion around the nut-insertion hole).

In view of this problem, it is an object of the present invention to provide a semiconductor apparatus capable of preventing breakage of a nut holder member, which is configured to hold a nut.

The semiconductor apparatus of according to one aspect of the present invention includes a main terminal connected to an external conductor by a screw, a nut into which a tip of the screw is screwed, and a nut holder. The nut holder includes a recess holding the nut therein, and a peripheral wall surrounding the recess and having an opening. The peripheral wall is discontinuous at a position at which the opening is formed.

The present invention can prevent breakage of a nut holder member, which is configured to hold a nut.

DESCRIPTION OF EMBODIMENTS

Figure 1A:
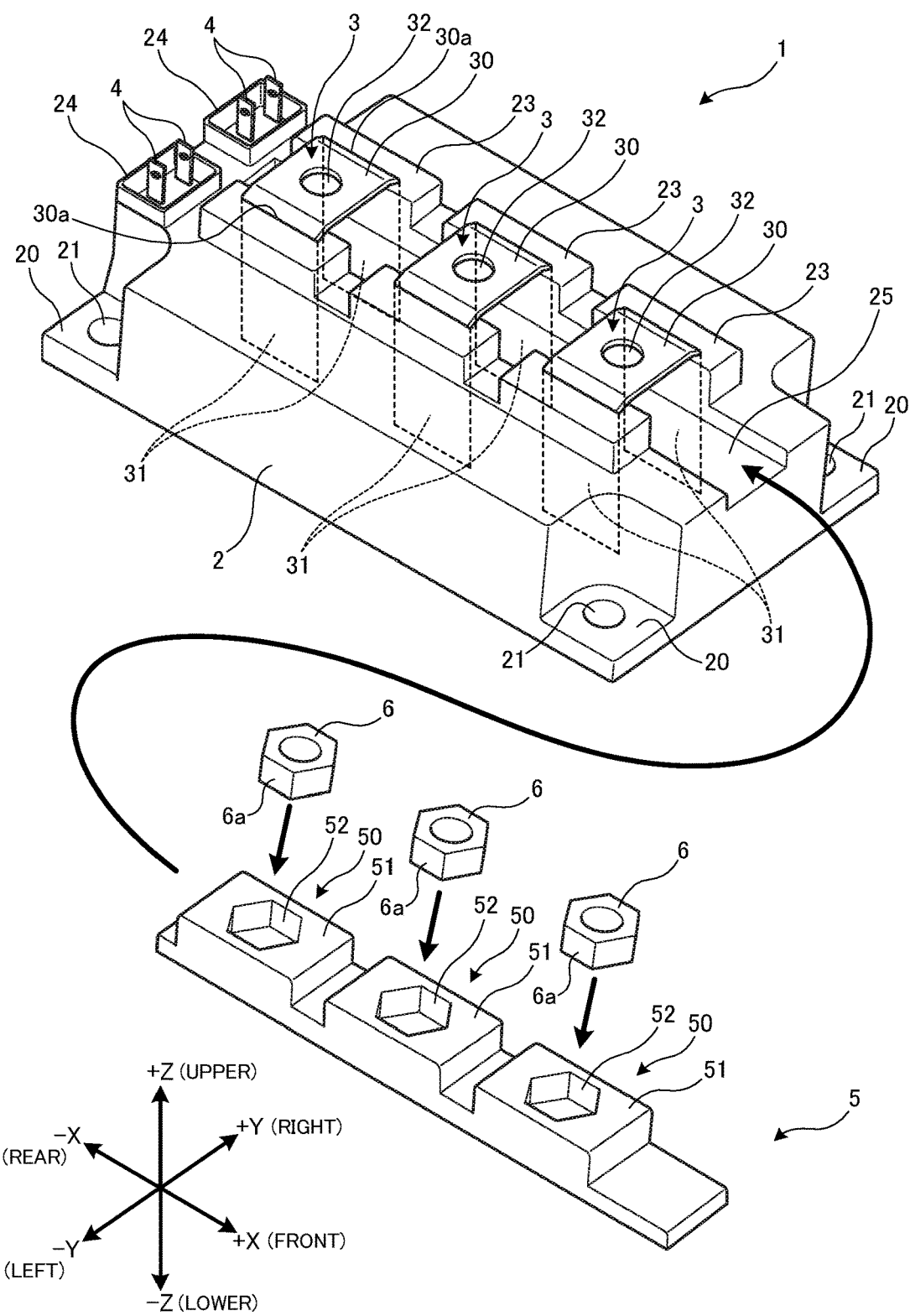
FIG. 1A is a perspective view and FIG. 1B is a side view each illustrating an example of a semiconductor apparatus.
Figure 1B:
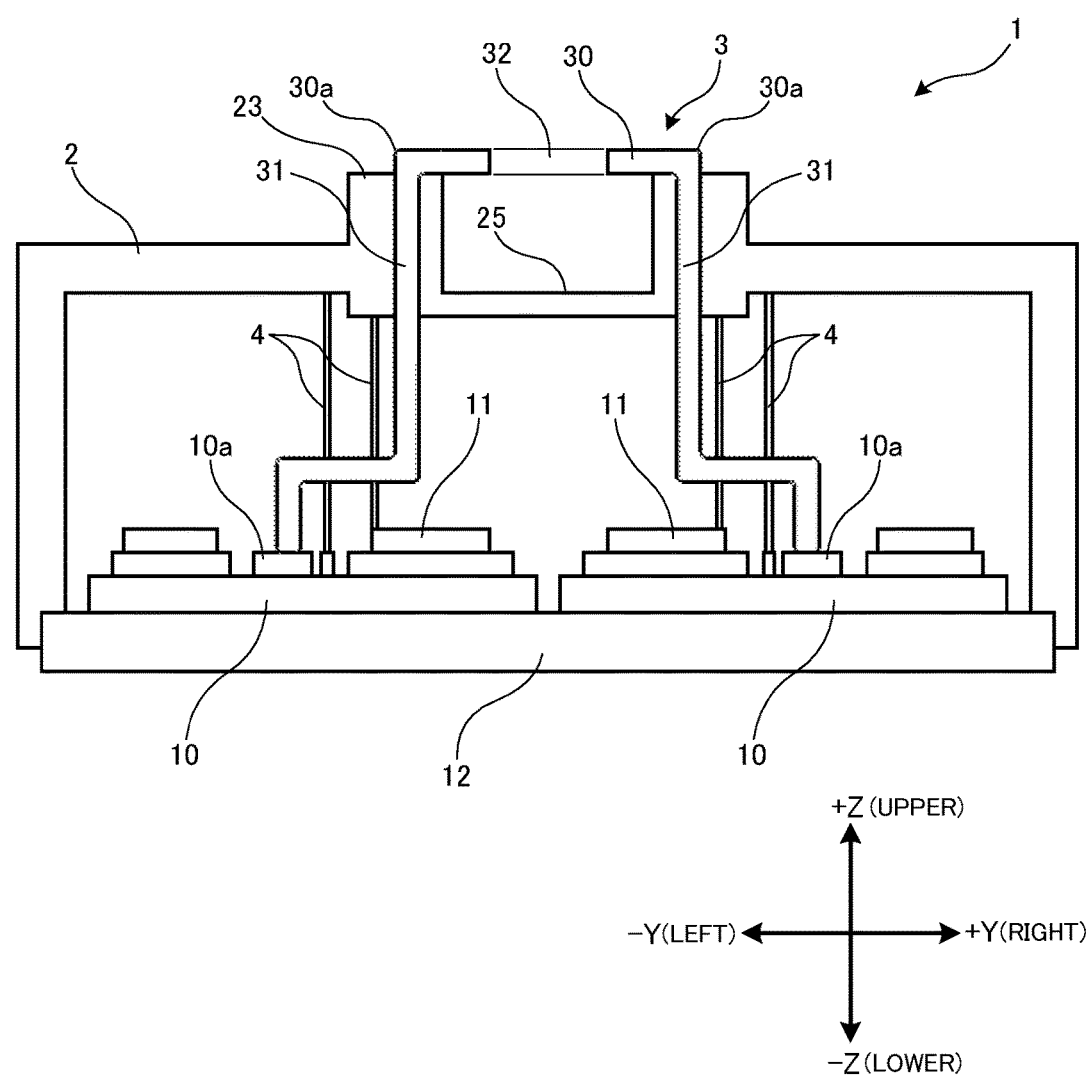

The following will explain a semiconductor apparatus to which the present invention can be applied. FIG. 1A is a perspective view illustrating an example of the semiconductor apparatus. Note that the semiconductor apparatuses described below are just examples, and can be modified without limitation as appropriate. In FIGS. 1A and 1B, the X, Y, and Z directions are respectively defined as the longitudinal, lateral, and height directions of the semiconductor apparatus. However, front-rear, left-right, and upper-lower directions may also be used to refer respectively to the X, Y, and Z directions. These directions (front-rear, left-right, and upper-lower directions) are used just for the sake of convenience of the explanation of FIGS. 1A and 1B, and may have different relationship respectively with the X, Y, and Z directions depending on the orientation in which the semiconductor apparatus is attached. Further, in the present specification, planar view means the case where the upper surface of the semiconductor device is viewed from the positive direction of the Z axis.

A semiconductor apparatus 1 as illustrated in FIGS. 1A and 1B is a package containing a plurality of semiconductor elements 11, and includes a case 2 that is housing a substrate 10 with semiconductor elements 11 mounted on it.

The semiconductor elements 11 are formed on semiconductor substrates made of a substance such as for example silicon (Si) and silicon carbide (SiC). Examples of the semiconductor elements include a switching element such as an insulated gate bipolar transistor (IGBT), a power metal oxide semiconductor field effect transistor (power MOSFET), etc. and a diode such as a free wheeling diode (FWD). The semiconductor elements may also be elements such as for example a reverse conducting IGBT (RC-IGBT), which results from integrating an IGBT and an FWD, and a reverse blocking IGBT (RB-IGBT) having a dielectric breakdown voltage sufficiently high against a reverse bias.

The substrate 10 is a laminated substrate in which a metal layer and an insulation layer are stacked and which is a rectangle long in the X directions in a plane vision. The surface of the substrate 10 has a metal pattern forming an electronic circuit 10a, to which three main terminals 3 and two control terminals 4 are connected. Also, the electronic circuit 10a has a semiconductor element mounted on it. The laminated substrate may include a plurality of laminated substrates.

The main terminals 3 are formed of bent metal plates, and have a portal shape or an arch-like shape seen in the X directions. Specifically, each of the main terminals 3 has a main surface (exposed portion) 30 facing the surface of the substrate 10 and parallel to the XY plane and has a pair of legs 31 that extend in the Z direction toward the substrate 10 from the two edges (ends) 30a of the main surface 30 in the Y directions. The legs 31 are coupled at their lower ends to the electronic circuit 10a on the surface of the substrate 10.

Each of the main surfaces 30 has, at its center, a through hole 32 piercing itself in the thickness direction (Z direction). The through holes 32 receive insertion of screws (not illustrated) for connecting an external conductor such as a bus bar (not illustrated) etc. The three main terminals 3 are arranged side by side at predetermined intervals in the longitudinal direction (X direction (insertion direction of the nut holding member 5 described later)) of the substrate substantially at the center in the Y direction. Note that any numbers (including one, two, four or more) of the main terminals 3 may be arrayed.

The control terminals 4 constitute a pair of elongate bodies that are long in a Z direction, are arranged in a Y directional array, and are made of for example metal plates. The control terminals 4 are coupled at their lower ends to the electronic circuit on the surface of the substrate. Two control terminals 4 are arranged in for example a Y directional array at an end of the substrate in an X directional end of the substrate. In FIGS. 1A and 1B, two control terminals 4 are arranged in a spot farther than (on the rear side with respect to) the main terminals 3 in the X direction. The semiconductor elements, the electronic circuit, the main terminals 3, and the control terminals 4 may be electrically coupled to form an inverter circuit.

The case 2 has a shape of a rectangular parallelepiped box having an open bottom (lower surface), is made of for example a resin material, and is configured to cover the upper side of the substrate. The case 2 has counterbores 20 at its four corners in the X and Y directions, and the bottoms of the counterbores 20 have through holes 21 piercing the areas in the Z direction. The through holes 21 are insertion holes for screws (not illustrated) used for fix the semiconductor apparatus 1. The case 2 may have a metal base plate 12 arranged on the bottom opening. The multilayer substrate 10 may be mounted on the base plate 12.

Also, the main surfaces 30 and the upper ends of the control terminals 4 are externally exposed as illustrated in FIGS. 1A and 1B when the case 2 is covering the substrate. Each of the terminals is supported by its supporting member formed on the case 2. Specifically, the case 2 includes main-terminal supporting members 23, which support the main terminals 3, and control-terminal supporting members 24, which support the control terminals 4.

The main-terminal supporting members 23 protrude from the upper surface of the case 2 so as to support the upper ends of the pairs of the legs 31, i.e., so as to support the two Y directional ends of each of the main surfaces 30. In FIGS. 1A and 1B, three pairs of the main-terminal supporting members 23, each of which is opposed to its corresponding main-terminal supporting member 23 in the Y directions, are formed in the X directions at prescribed intervals so as to match the positions of the main terminals 3. The control-terminal supporting members 24 have a shape of a rectangular parallelepiped extending in a Z direction to surround the control terminals 4.

Also, the case 2 has, on its upper surface, a groove extending in the X directions between the pairs of the legs 31 and below the main surfaces 30. This groove functions as an insertion groove 25 that permits the insertion of the nut holder 5, which will be described later. The insertion groove 25 has a left-right width (a Y directional width) conforming to the interval between the opposed legs 31 of each pair, extends in the X directions, and has a prescribed depth. Specifically, the insertion groove 25 is configured to have a left-right width smaller than the interval between the opposed legs 31 of each pair.

The nut holder member 5 is configured to hold a plurality of nuts 6. The nuts 6 may be for example hexagonal nuts produced as standardized products. The nut holder member 5 has a shape of an elongate body long in the X directions, and is made of for example a resin material. The nut holder member 5 has a left-right width and an X directional length that are respectively conforming to the left-right width (Y directional width) and the X directional length of the insertion groove 25 and, has nut receiving portions 50 for receiving the nuts 6 at positions matching those of the main surfaces 30.

Specifically, each of the nut receiving portions 50 has a swelling portion 51, which swells in a Z direction so as to conform to its corresponding main-terminal supporting members 23 of the case 2, and the upper surface of the swelling portion 51 has a concave portion (recess) 52 hexagonal in a plane vision so as conform in shape to the nuts 6. Specifically, three nut receiving portions 50 are formed in an X directional array with prescribed intervals in such a manner as to positionally conform to the through holes 32 of the main surfaces 30.

As will be described later in detail, each of the hexagonal recesses 52 is configured to receive the nut 6 in such a manner that one of the pairs of external-circumferential surfaces 6a (opposed surfaces 6a), which define the hexagonal shape of the nut 6, extend in the X directions, in which the nut holder member 5 also extends. In other words, one of the pairs of the external-circumferential surfaces 6a, which define the hexagonal shape of the nut 6, are opposed to each other in a direction identical (parallel) to the direction in which a pair of the legs 31 are opposed to each other. Also, the recesses 52 desirably have a depth greater than or equal to the thickness of the nuts 6.

When the nut holder member 5 with the nut receiving portions 50 having received the nuts 6 is inserted into the insertion groove 25 and put at a prescribed position, the through holes 32 of the main surfaces 30 and the screw holes of the nuts 6 are aligned in the X and Y directions. In other words, the nut holder member 5 is inserted until it reaches a position at which the main surfaces 30 and their corresponding nuts 6 received in the recesses 52 face each other in the Z directions. More specifically, the nut holder member 5 is inserted until it reaches a position at which the centers of the nuts 6 received in the recesses 52 and the centers of the through holes of the main surfaces 30 are aligned. Then, it is possible to screw the tips of the screws (not illustrated) through the through holes 32 into the nuts 6 through the external conductor (not illustrated). The screwing thereby brings about contact between the main surfaces 30 of the main terminals 3 and the external conductor.

Incidentally, the intervals between the opposed legs 31 in pairs restrict the Y directional dimension (width) of the nut holder member 5 that is inserted into a space under the main terminals 3 having a portal shape as described above. This restriction may result in thin portions around the recesses 52 when the recesses 52 conforming in shape to the nuts 6 are to be formed according to the dimensions of the nut holder member 5. In that case, the thin portions may fail to resist the tightening torque of the screws to break the nut holder member 5, depending on the size of the nuts 6.

Figure 2A:
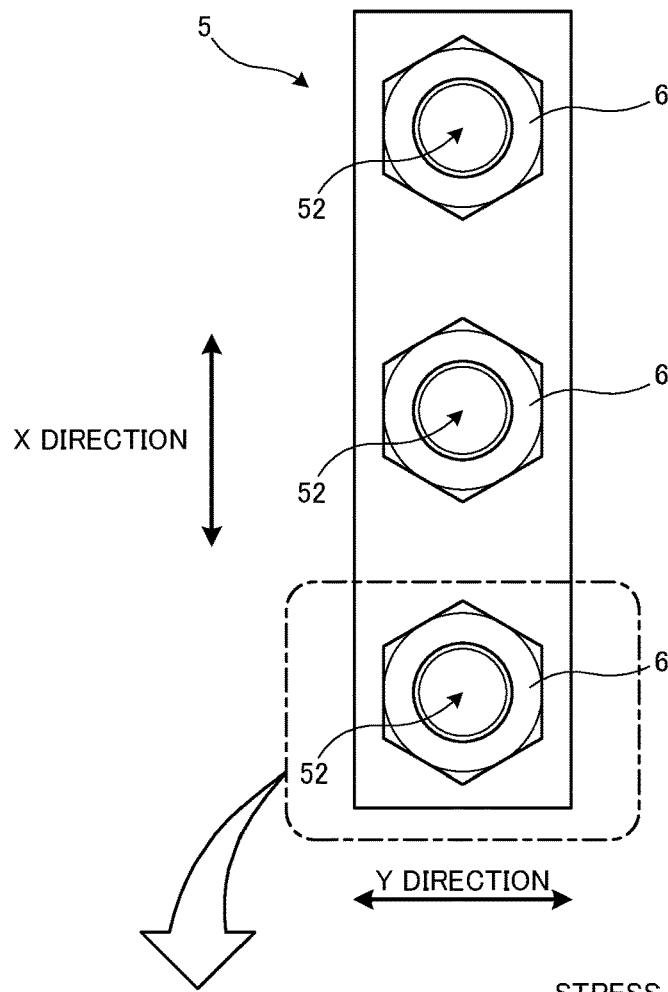
FIGS. 2A and 2B are plan views illustrating a nut holder member of a comparison example.
Figure 2B:
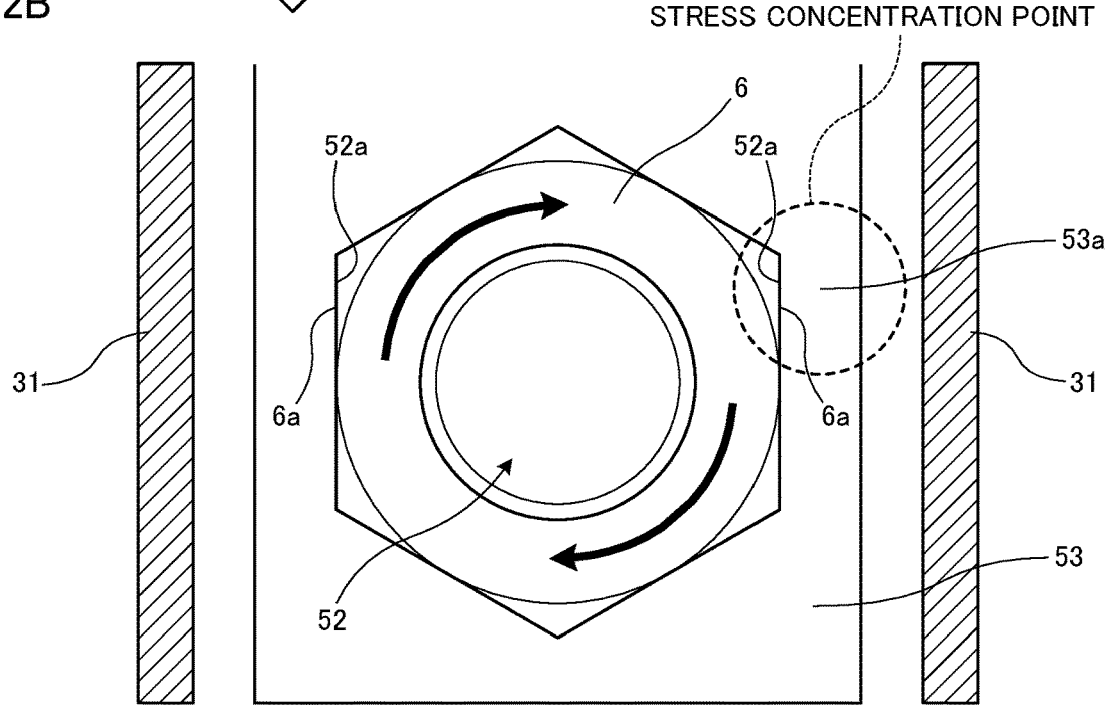

FIGS. 2A and 2B specifically explain this phenomenon. FIGS. 2A and 2B are plan views illustrating a nut holder member according to a comparison example. FIG. 2A is an overall plan view, and FIG. 2B is an enlarged partial view of FIG. 2A. FIGS. 2A and 2B, which are schematic, illustrate the same basic function as that illustrated in FIGS. 1A and 1B for the sake of convenience of the explanation although FIGS. 2A and 2B illustrate a nut holder member somewhat different in shape from that of FIGS. 1A and 1B. Also, components that have already appeared are denoted by the same numerals as those in FIGS. 1A and 1B.

As illustrated in FIG. 2A, the nut holder member 5 of the comparison example is an elongate body that is long in the X directions. Three recesses 52 functioning as nut receivers are formed in a longitudinal array. Each of the recesses 52 is hexagonal in a plane vision as described above, and has its center at the middle of the Y directional width of the nut holder member 5.

Also, as illustrated in FIG. 2B, each of the recesses 52 is configured in such a manner that one of the pairs of the external-circumferential surfaces 6a, which define the hexagonal shape of the nut 6, are opposed in a direction identical (parallel) to the direction in which a pair of the legs 31 are opposed to each other. Setting the width dimension of the nut holder member 5 to be smaller than the interval at which the pairs of the legs 31 are opposed and forming the recesses 52 for receiving the nuts 6 within that width dimension as described above, results in thin portions 53a in part of surrounding portions (peripheral wall) 53 around the formed recesses 52. Specifically, a thin portion 53a is formed by part of a surrounding portion 53 existing between one of the legs 31 and a concave 52.

In the above configuration in which the nut holder member 5 made by molding a resin holds the nuts 6, the nuts 6 are held in the recesses 52 with their external-circumferential surfaces 6a abutting the entirety of the internal-circumferential surfaces 52a of the recesses 52 in the comparison example. In such a case, the thin portions 53a, which are believed to have relatively small rigidity, receive concentrated stress due to the tightening torque caused by screwing the screws into the nuts 6. This concentrated stress may break the nut holder member 5, starting from the thin portions 53a.

Using a nut holder member 5 with a greater thickness or using a material having higher rigidity for the nut holder member 5 may prevent this phenomenon; however the nut holder member 5 is under restrictions on its width dimension as described above, and increasing the thickness or rigidity of the nut holder member 5 can increase material costs. A thin portion 53a in a product to be produced through resin molding may prevent the resin from sufficiently flowing into the thin portion 53a during the molding, which may cause deficient molding.

Figure 3A:
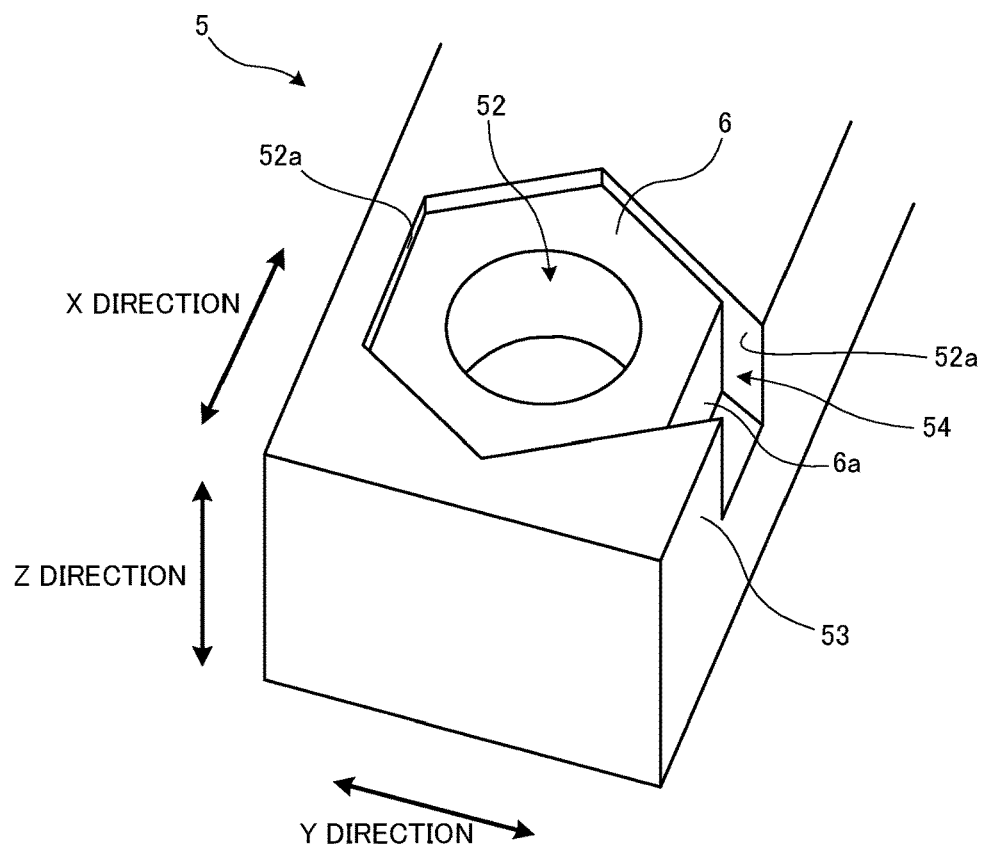
FIGS. 3A and 3B are enlarged partial views illustrating a nut holder member of the present embodiment.
Figure 3B:
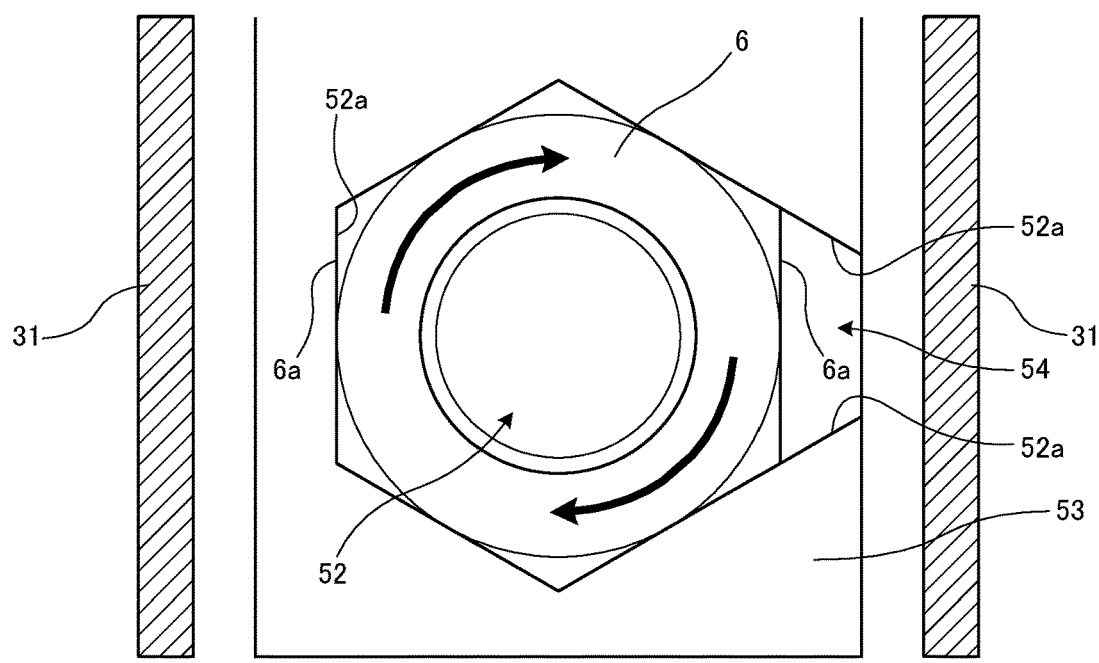

In view of this problem, the inventors of the present invention have focused our attention on the thin portions 53a to conceive the idea of the present invention. Specifically, the present embodiment provides the thin portions 53a with openings (hereinafter, also referred to as notches) so that no portions receive concentrated stress caused by tightening the screws. The following explains a nut holder member of the present embodiment by referring to FIGS. 3A and 3B. FIGS. 3A and 3B are enlarged partial views of the nut holder member of the present embodiment. FIG. 3A is a partial perspective view of the nut holder member, and FIG. 3B is a plan view of the nut holder member. The nut holder member 5 appearing in FIGS. 3A and 3B are different from those of FIGS. 2A and 2B only in that parts of the surrounding portions 53 around the recesses 52 have notches (openings) 54. Accordingly, components that have already appeared are denoted by the same numerals, and explanations thereof will be omitted as appropriate. Note that while the "surrounding portion 53" does not specify its particular shape, it refers to the entire portion surrounding the outer peripheries of the recesses 52 to define them, and the figures do not illustrate the boundary between them. In other words, the "surrounding portion 53" refers to the entire portion surrounding the outer periphery of the concave 52 in this specification. Also, while FIGS. 3A and 3B only illustrate a notch 54 that is formed for one of the recesses 52, the other recesses 52 as well respectively have the notches 54.

As illustrated in FIG. 3A, part of the surrounding portion 53 around the concave 52 has the notch 54. More specifically, the notch 54 is formed in the surrounding portion 53 that is opposed to a pair of the legs 31 as illustrated in FIG. 3B. The surrounding portion 53 (the surrounding portion 53 on the right side in FIGS. 3A and 3B) is provided with an opening that is defined by the surfaces extended from the internal-circumferential surfaces 52a, of the concave 52, that are abutted by the two edges of the external-circumferential surfaces 6a of the nut 6 opposed to the leg 31. Thereby, one of the external-circumferential surfaces 6a, of the nut 6, opposed to the leg 31 is exposed to the outside without being surrounded by the nut holder member 5. In other words, that exposed external-circumferential surface 6a is not abutting the internal-circumferential surface 52a of the concave 52. Note in FIGS. 3A and 3B that the notch 54 has a shape of an isosceles trapezoid in which the surfaces extended from the internal-circumferential surfaces constitute the non-parallel sides of the trapezoid in a plane vision.

The present embodiment forms the notch 54 in part of the surrounding portion 53, which may turn into the thin portion 53a (see FIGS. 2A and 2B) due to restrictions on the width dimension of the nut holder member 5, intentionally preventing contact between the external-circumferential surface 6a of the nut 6 and the thin portion 53a as described above. This enables the surrounding portions 53 other than the thin portions 53a to receive the stress without imposing loads on the thin portions 53a because the surrounding portions 53 are thicker than the thin portions 53a. Thereby, stress can be prevented from concentrating on a portion having lower rigidity when tightening the screws. This configuration, which inherently has no breakable thin portion 53a, can avoid the breakage of the nut holder member 5. In other words, the present invention beforehand provides the thin portion 53a, which may be broken by concentrated stress, and thereby can prevent the nut holder member 5 from being broken by concentrated stress caused by tightening the screws. The absence of the thin portions 53a can also prevent deficient molding because the sufficient resin flow is maintained.

Figure 4:
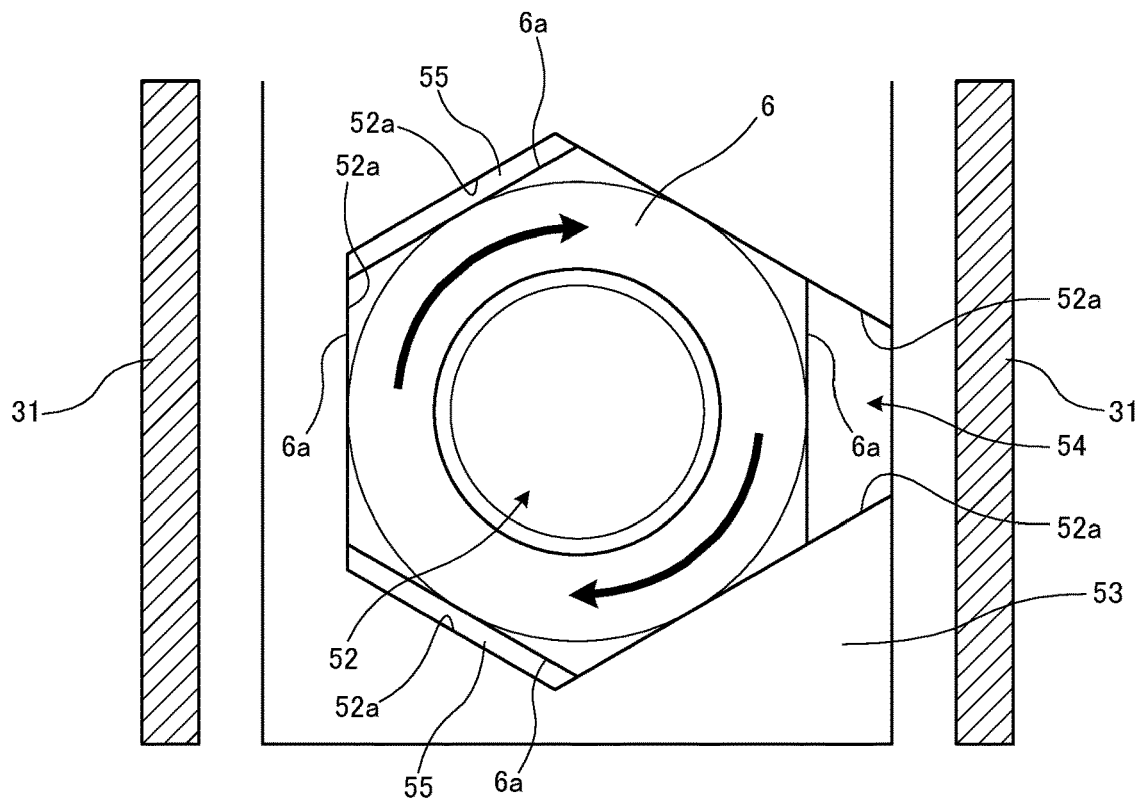
FIG. 4 is an enlarged partial view of a nut holder member of a variation example.

Next, a variation example will be explained by referring to FIG. 4. FIG. 4 is an enlarged partial view of a nut holder member according to the variation example. In the variation example, explanations will only be given to aspects different from the above embodiment, and components that have already appeared will be denoted by the same numerals so that their explanations will be omitted as appropriate.

In the nut holder member 5 appearing in FIG. 4, the internal-circumferential surfaces 52a, which belong to the recesses 52 and are positioned at prescribed angular intervals, have prescribed gaps 55 formed respectively between the internal-circumferential surfaces 52a and their corresponding external-circumferential surfaces 6a of the nut 6 to prevent contact between such internal-circumferential surfaces 52a and their corresponding external-circumferential surfaces 6a of the nut 6. The prescribed angle is 120 degrees around the axis of the concave 52 (or the nut 6) with respect to the position having the notch 54. In other words, the gaps 55 are provided at prescribed angular intervals with respect to the notch 54 between the external-circumferential surfaces 6a of the nut 6 and the internal-circumferential surfaces 52a of the concave 52 opposed to those external-circumferential surfaces 6a. The gaps 55 have a shape of an isosceles trapezoid in which the internal-circumferential surface 52a and the external-circumferential surface 6a partially coincide respectively with the upper base and the lower base in a plane vision.

This configuration avoids contact between the external-circumferential surfaces 6a of the nuts 6 and the internal-circumferential surfaces 52a of the recesses 52 not only by the notches 54 but also by the gaps 52. That is, each of the recesses 52 can have, at prescribed angular intervals (intervals of 120 degrees), three portions in which the external-circumferential surfaces 6a of the nut 6 and the internal-circumferential surfaces 52a of the concave 52 are brought into contact, achieving uniform distribution of the stress that the surrounding portion 53 receives when the screw is tightened. This can further reduce the risk of the breakage of the nut holder member 5.

While the present embodiment uses the main terminals 3 having a portal shape so that the nut holder member 5 is inserted into the case 2 in a longitudinal direction (X direction), this configuration is not limiting the scope of the invention. For example, the main terminals 3 may have a L-shape seen in an X direction so that the nut holder member 5 is inserted into the case 2 in a Y direction. Also, the present invention can be applied to any configuration that may have a thin portion 53a depending not only on the shape of the main terminals 3 but also on the width dimension of the nut holder member 5.

While the present embodiment forms the notch 54 on one of the sides of each surrounding portion 53 opposed to a pair of the legs 31, this configuration is not limiting the scope of the invention. The notch 54 may be formed on the other side as well. In addition, while the notch 54 is formed in such a manner as to entirely expose one of the external-circumferential surfaces 6a to the outside, this configuration is not limiting the scope of the invention. The notches 54 can have various appropriate shapes. For example, the notch 54 may be formed by cutting out part of the surrounding portion 53 in such a manner as to expose part of one external-circumferential surface 6a to the outside in accordance with the portion receiving concentrated stress or taking such a portion into consideration.

Figure 5:
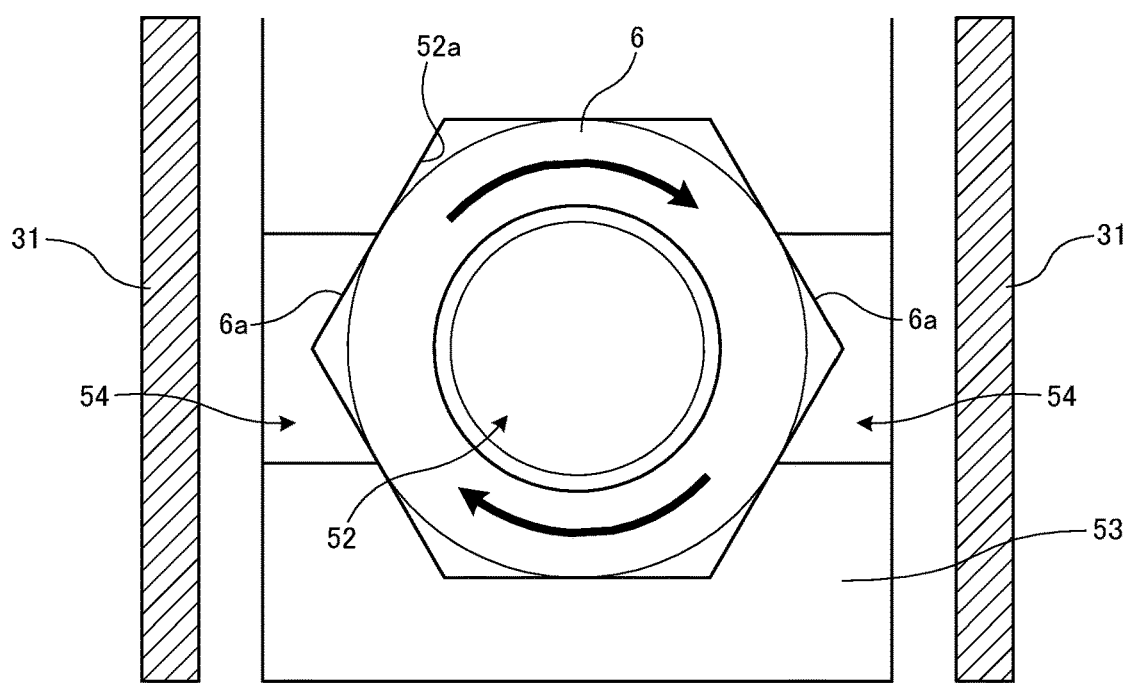
FIG. 5 is a plan view of a nut holder member of another variation example.

While the present embodiment has a pair of the external-circumferential surfaces 6a defining the hexagonal shape of the nut 6 that are opposed to each other in a direction identical to the direction in which a pair of the legs 31 are opposed to each other, this configuration is not limiting the scope of the invention. For example, each of the recesses 52 may be formed in such a manner that the nut 6 is received in it with a 90-degree rotational shift around the axis of the nut 6 and the nut 6 has a longer diagonal line in a direction identical to the direction in which a pair of the legs 31 are opposed to each other as in the variation example of FIG. 5. In that case, both of the left and right sides desirably have the notches 54, respectively.

Figure 6A:
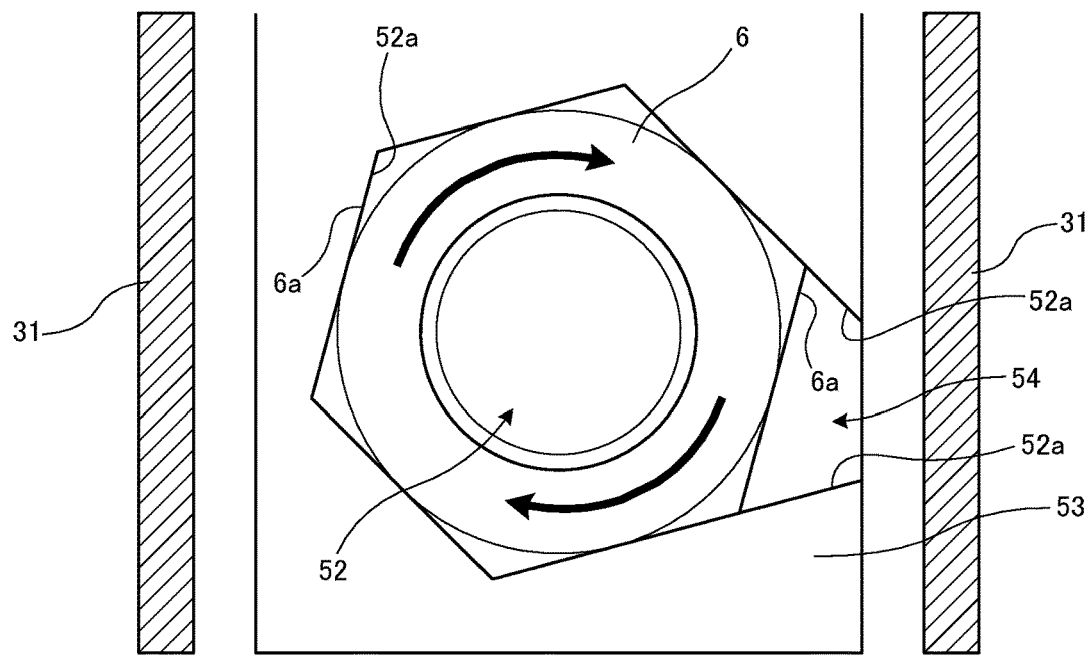
FIGS. 6A and 6B are plan views illustrating a modification of a nut holder member of another variation example.
Figure 6B:
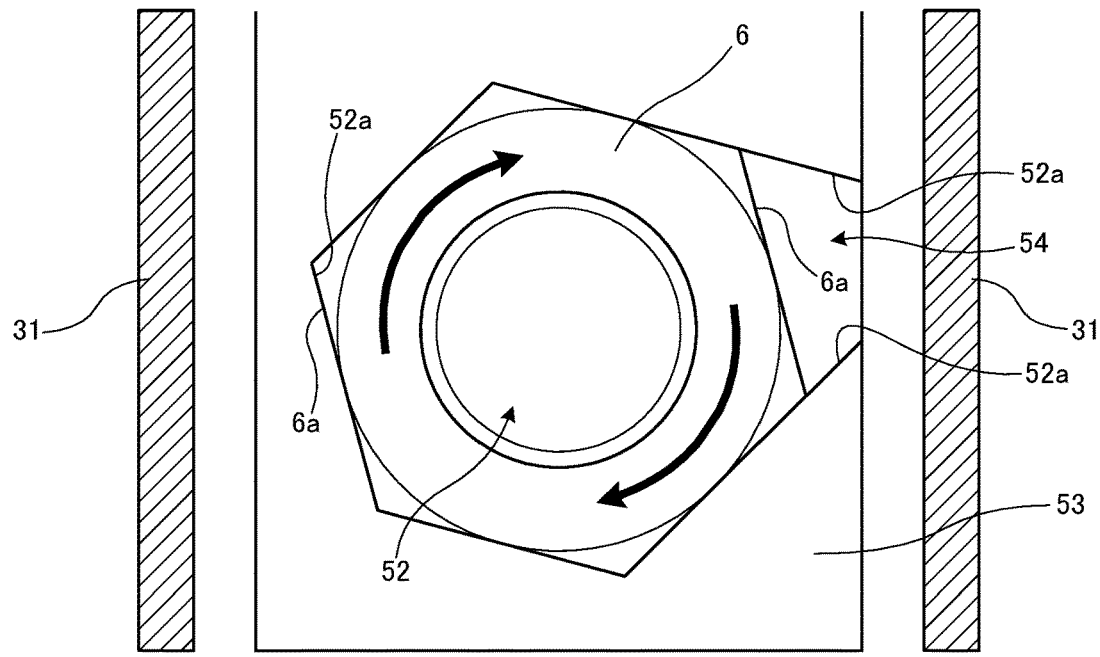

While the present embodiment uses the notches 54 having a shape of an isosceles trapezoid in a plane vision in which the surfaces extended from the internal-circumferential surfaces constitute its non-parallel sides, this configuration is not limiting the scope of the invention. The notches 54 may have various appropriate shapes. Variation examples are also possible including those as illustrated in FIG. 6A and FIG. 6B. FIG. 6A illustrates an example in which the concave 52 is positioned at an angle different from that of FIG. 3B by a prescribed clockwise angular difference, and FIG. 6B illustrates an example in which the concave 52 is positioned at an angle different from that of FIG. 3B by a prescribed counterclockwise angular difference. In these cases, each of the surfaces extended from the internal-circumferential surfaces 52a for defining the external shape of the notch 54 is parallel to the internal-circumferential surface 52a that are connected to the extended surface, and the notch 54 may take a shape other than an isosceles trapezoid in a plane vision as illustrated in FIG. 6A and FIG. 6B. Also, the notch 54 may have an opening with a length smaller than one of the sides of the nut 6 along the edge of the surrounding portion 53 in a Y direction. Further, the notch 54 may take, for example, a rectangular shape in a plane vision in which the pair of the extended surfaces opposed in the X directions of FIG. 3B are parallel.

While the present embodiment uses the gap 55 having a shape of an isosceles trapezoid in a plane vision in which the internal-circumferential surface 52a and the external-circumferential surface 6a partially coincide respectively with the upper base and the lower base, this configuration is not limiting the scope of the invention. For example, the gap 55 may be rectangular in a plane vision.

Further, while the present embodiment employs a configuration of arraying three main terminals 3 in the X directions, this configuration is not limiting the scope of the invention. Any numbers (including one, two, four or more) of the main terminals 3 may be arrayed. The main terminals 3 may be arrayed in any appropriate directions including an X direction and others.

While explanations have been given to the present embodiment and the variation examples, full or partial combinations of the present embodiment and the variation examples may constitute additional embodiments.

The present embodiment is not limited to the above embodiments or variation examples, but allows various modifications, substitutions, and alterations without departing from the spirit of the technical concept. Further, the present embodiment may be implemented by any other methods that are based on potential technical advance or based on a derivative technique capable of embodying the technical concept. The scope of the claims, therefore, encompasses all embodiments that can fall within the scope of the technical concept.

The following lists the features of the above embodiments. The semiconductor apparatus of the above embodiment includes a main terminal connected to an external conductor by a screw, a nut into which a tip of the screw is screwed, and a nut holder including a recess holding the nut therein, and a peripheral wall surrounding the recess and having an opening, the peripheral wall being discontinuous at a position at which the opening is formed.

The semiconductor apparatus of the embodiment further includes a substrate having an electronic circuit formed therein, the main terminal being connected to the electronic circuit, a case housing the substrate and exposing a portion of the main terminal to the exterior of the case. The case includes an insertion groove, the nut holder being inserted in the insertion groove so that an exposed portion of the main terminal faces the nut.

In the semiconductor apparatus of the embodiment, the main terminal includes a main surface, including the exposed portion, facing a surface of the substrate and having two ends, and a pair of legs each extending from a corresponding one of the two ends of the main surface toward the substrate. The main surface includes a through hole through which the screw is inserted, the insertion groove is disposed between the pair of the legs, the nut holder is inserted so that a center of the nut held in the recess is aligned with a center of the through hole, and the opening of the nut holder faces one of the pair of the leg positions.

In the semiconductor apparatus of the embodiment, the main terminals are arranged in a direction in which the nut holder is inserted.

In the semiconductor apparatus of the embodiment, the nuts are hexagon nuts, each of the recesses has a hexagon shape that corresponds to a shape of the nut in a plan view, and one of pairs of opposed surfaces defining the hexagon shape of each of the nuts is parallel to a surface of one of the pair of the legs.

In the semiconductor apparatus of the embodiment, each of the recesses has a shape defining a gap between an inner wall therein and an external surface of a corresponding one of the nuts, the gap being positioned at a prescribed angular interval with respect to the opening.

INDUSTRIAL APPLICABILITY

The present invention, as described above, achieves an effect of preventing breakage of a nut holder member used for holding a nut, and is applicable particularly to semiconductor apparatuses.

EXPLANATIONS OF LETTERS OR NUMERALS

1: Semiconductor Apparatus
2: Case
3: Main Terminal
4: Control Terminal
5: Nut Holder Member
6: Nut
6a: External-Circumferential Surface (Opposed Surface)
10: Substrate
10a: Electronic Circuit
11: Semiconductor Element
12: Base Plate
21: Through Hole
23: Main-Terminal Supporting Member
24: Control-Terminal Supporting Member
25: Insertion Groove
30: Main Surface
30a: Edge
31: Leg
32: Through Hole
50: Nut Receiving Portion
51: Swelling Portion
52: Recess
52a: Internal-Circumferential Surface
53: Surrounding Portion
53a: Thin Portion
54: Notch
55: Gap

What is claimed is:

1. A semiconductor apparatus, comprising:
a main terminal connected to an external conductor by a screw;
a nut into which a tip of the screw is screwed; and
a nut holder including a recess holding the nut therein, and a peripheral wall surrounding the recess so as to face in a direction orthogonal to a rotation axis of the screw, an external surface of the nut and having an opening, the peripheral wall being discontinuous in a rotation direction of the screw at a position at which the opening is formed.

2. The semiconductor apparatus according to claim 1, further comprising
a substrate having an electronic circuit formed therein, the main terminal being connected to the electronic circuit,
a case housing the substrate and exposing a portion of the main terminal to the exterior of the case, wherein
the case includes an insertion groove, the nut holder being inserted in the insertion groove so that an exposed portion of the main terminal faces the nut.

3. The semiconductor apparatus according to claim 2, wherein
the main terminal includes
a main surface, including the exposed portion, facing a surface of the substrate and having two ends, and
a pair of legs each extending from a corresponding one of the two ends of the main surface toward the substrate, wherein
the main surface includes a through hole through which the screw is inserted,
the insertion groove is disposed between the pair of the legs,
the nut holder is inserted so that a center of the nut held in the recess is aligned with a center of the through hole, and
the opening of the nut holder faces one of the pair of the legs.

4. The semiconductor apparatus according to claim 1, wherein the opening of the peripheral wall of the nut holder penetrates through the peripheral wall in the direction orthogonal to the rotation axis of the screw.

5. A semiconductor apparatus, comprising:
a plurality of main terminals each of which is connected to an external conductor by a screw;
a plurality of nuts into each of which a tip of the screw is screwed; and
a nut holder including a plurality of recesses each of which holds a corresponding one of the nuts therein, and a plurality of peripheral walls each of which surrounds a corresponding one of the recesses so as to face in a direction orthogonal to a rotation axis of the screw, an external surface of the corresponding one of the nuts and has an opening, each peripheral wall being discontinuous in a rotation direction of the screw at a position at which a corresponding one of the openings is formed.

6. The semiconductor apparatus according to claim 5, further comprising
a substrate having an electronic circuit formed therein, each main terminal being connected to the electronic circuit,
a case housing the substrate and exposing a portion of said each main terminal to the exterior of the case, wherein
the case includes an insertion groove, the nut holder being inserted in the insertion groove so that an exposed portion of said each main terminal faces a corresponding one of the nuts.

7. The semiconductor apparatus according to claim 6, wherein
said each main terminal includes
a main surface, including the exposed portion, facing a surface of the substrate and having two ends, and
a pair of legs each extending from a corresponding one of the two ends of the main surface toward the substrate, wherein
the main surface includes a through hole through which the screw is inserted, the insertion groove is disposed between the pair of the legs of said each main terminal, the nut holder is inserted so that a center of each of the nuts is aligned with a center of each of the through holes, and each of the openings of the nut holder faces one of a corresponding pair of the legs.

8. The semiconductor apparatus according to claim 7, wherein the main terminals are arranged in a direction in which the nut holder is inserted.

9. The semiconductor apparatus according to claim 8, wherein the nuts are hexagon nuts, each of the recesses has a hexagon shape that corresponds to a shape of the corresponding one of the nuts in a plan view, and one of pairs of opposed surfaces defining the hexagon shape of each of the nuts is parallel to a surface of one of the pair of the legs.

10. The semiconductor apparatus according to claim 9, wherein each of the recesses has a shape defining a gap between an inner wall therein and the external surface of the corresponding one of the nuts, the gap being positioned at a prescribed angular interval with respect to the opening.

11. The semiconductor apparatus according to claim 5, wherein the opening of one of the plurality of peripheral walls penetrates through the one of the plurality of peripheral walls in the direction orthogonal to the rotation axis of the screw.

\* \* \* \* \*